(12) United States Patent
Marmet

(10) Patent No.: US 9,048,852 B2
(45) Date of Patent: Jun. 2, 2015

(54) FREQUENCY STABILIZATION OF AN ATOMIC CLOCK AGAINST VARIATIONS OF THE C-FIELD

(75) Inventor: Louis Marmet, Ottawa (CA)

(73) Assignee: National Research Council of Canada, Ottawa, Ontario (CA)

( * ) Notice: Subject to any disclaimer, the term of this patent is extended or adjusted under 35 U.S.C. 154(b) by 0 days.

(21) Appl. No.: 14/002,583

(22) PCT Filed: Feb. 6, 2012

(86) PCT No.: PCT/CA2012/000086
§ 371 (c)(1),
(2), (4) Date: Aug. 30, 2013

(87) PCT Pub. No.: WO2012/116427
PCT Pub. Date: Sep. 7, 2012

(65) Prior Publication Data
US 2013/0335154 A1    Dec. 19, 2013

Related U.S. Application Data

(60) Provisional application No. 61/447,850, filed on Mar. 1, 2011.

(51) Int. Cl.
| | |
|---|---|
| *H03L 7/26* | (2006.01) |
| *H01S 1/06* | (2006.01) |
| *H03B 17/00* | (2006.01) |
| *G04F 5/14* | (2006.01) |

(52) U.S. Cl.
CPC .... *H03L 7/26* (2013.01); *H03B 17/00* (2013.01); *H01S 1/06* (2013.01); *G04F 5/145* (2013.01)

(58) Field of Classification Search
CPC ............. G04F 5/14; G04F 5/145; H01S 1/06; H03B 17/00; H03L 7/26
USPC ....................................................... 331/3, 94.1
See application file for complete search history.

(56) References Cited

U.S. PATENT DOCUMENTS

| | | | | |
|---|---|---|---|---|
| 3,150,313 A | * | 9/1964 | Dehmelt | 324/304 |
| 3,165,705 A | * | 1/1965 | Dicke | 331/3 |
| 3,205,490 A | * | 9/1965 | Francisco | 341/111 |
| 3,246,254 A | * | 4/1966 | Bell et al. | 331/3 |

(Continued)

FOREIGN PATENT DOCUMENTS

EP        2154586        2/2010

OTHER PUBLICATIONS

Stern, A., et al—(1992) "Rubidium Frequency Standard With a High Resolution Digital Synthesizer." Proceedings of the 46th IEEE International Frequency Control Symposium. 108, 1992.

(Continued)

*Primary Examiner* — Levi Gannon
(74) *Attorney, Agent, or Firm* — Jason E. J. Davis

(57) ABSTRACT

The frequency of an atomic clock may be stabilized against C-field variation by applying a rf magnetic field perpendicular to the C-field to cause a coherent population transfer between Zeeman states that compensates for quadratic frequency shift of transitions of the clock. The cancellation, provided by a feed-forward mechanism, is exact. The invention can be implemented in any atomic clock by including an electrode in the clock generating a magnetic field perpendicular to the C-field, and providing an electronic circuit to send rf signals to the electrode.

10 Claims, 6 Drawing Sheets

(56) References Cited

U.S. PATENT DOCUMENTS

| | | | |
|---|---|---|---|
| 3,513,381 A * | 5/1970 | Happer, Jr. | 324/304 |
| 3,575,655 A * | 4/1971 | Dehmelt | 324/304 |
| 4,740,761 A | 4/1988 | Barnes et al. | |
| 4,943,955 A | 7/1990 | Rabian et al. | |
| 4,953,148 A | 8/1990 | Lepek et al. | |
| 5,146,184 A | 9/1992 | Cutler | |
| 6,025,755 A | 2/2000 | Camparo | |
| 6,303,928 B1 | 10/2001 | Buell et al. | |
| 6,320,472 B1 | 11/2001 | Vanier | |
| 6,614,321 B2 | 9/2003 | Avinoam et al. | |
| 6,831,522 B2 | 12/2004 | Kitching et al. | |
| 6,888,780 B2 | 5/2005 | Happer et al. | |
| 6,919,770 B2 | 7/2005 | Happer et al. | |
| 7,173,421 B2 * | 2/2007 | Hannah | 324/300 |
| 7,323,941 B1 | 1/2008 | Happer et al. | |
| 7,379,486 B2 | 5/2008 | Lust et al. | |
| 7,439,814 B2 | 10/2008 | Happer et al. | |
| 7,468,637 B2 * | 12/2008 | Braun et al. | 331/94.1 |
| 7,825,736 B2 | 11/2010 | McGuyer et al. | |
| 7,852,163 B2 | 12/2010 | Braun et al. | |
| 2007/0247241 A1 | 10/2007 | Braun et al. | |
| 2010/0033256 A1 | 2/2010 | Strabley et al. | |
| 2010/0188081 A1 | 7/2010 | Lammegger | |
| 2010/0259256 A1 * | 10/2010 | Le Prado et al. | 324/244.1 |
| 2010/0321117 A1 | 12/2010 | Gan | |
| 2012/0062221 A1 * | 3/2012 | Le Prado et al. | 324/244 |

OTHER PUBLICATIONS

Shah V., et al—Continuous light-shift correction in modulated coherent population trapping clocks—Applied Physics Letters 89, 1151124 (2006).

Rubiola, E., et al—(1993) "A Dual Frequency Synthesis Scheme for a High C-Field Cesium Resonator." Proceedings of the 47th IEEE International Frequency Control Symposium. 105, 1993.

Marmet, Louis et al (2010) "Evaluation of NRC-FCsI: Mapping the C-field using the Larmor Frequency". IEEE International Frequency Control Symposium. 312-317, 2010.

Lutwak, R., et al—The Chip-Scale Atomic Clock—Coherent Population Trapping Vs. Conventional Interrogation —34th Annual Precise Time and Time Interval (PTTI) Meeting, 2002.

Knappe, S., et al—A Chip-Scale Atomic Clock Based on 87Rb with improved Frequency Stability—Time and Frequency Division, National Institute of Standards and Technology, 2005.

Hewlett-Packard 5062C (1974) "Cesium Beam Frequency ReferenceTraining Manual". http://www.leapsecond.com/museum/hp5062c/theory.htm, Nov. 1974.

Gerginov et al—Long-Term Frequency Instability of Atomic Frequency References Based on Coherent Population Trapping and Microfabricated Vapor Cells—vol. 23, No. 4/Apr. 2006/J. Opt. Soc. Am.B—pp. 593-597.

Camparo, James—The Rubidium Atomic Clock and Basic Research, Nov. 2007 Physics Today pp. 33-39.

De Marchi, A., "The high C-field concept for an accurate cesium beam resonator", Proc. 7th European Frequency and Time Forum, Neuchatel, Switzerland, Mar. 1993.

Marmet, L. (2011) "Reduction of the Magnetic Sensitivity of an Atomic Clock Against the non-Uniformity and Variations of the C-field", IEEE International Frequency Control Symposium, 1-5.

Ramsey, N.F. (1950) "A Molecular Beam Resonance Method with Separated Oscillating Fields," Physical Review, vol. 78, Issue 6: 695-699; Jun. 15, 1950.

* cited by examiner

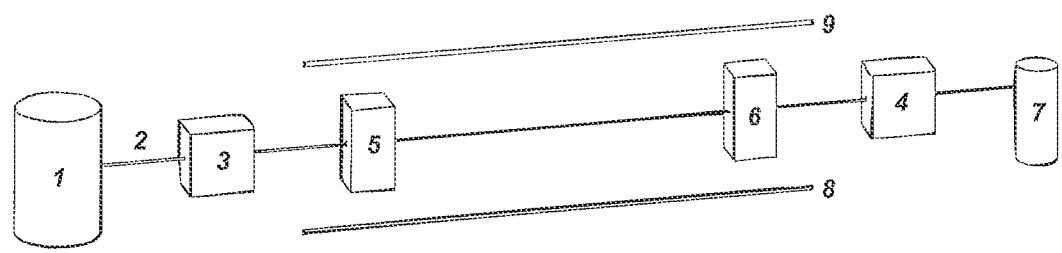
Prior Art    Fig. 1
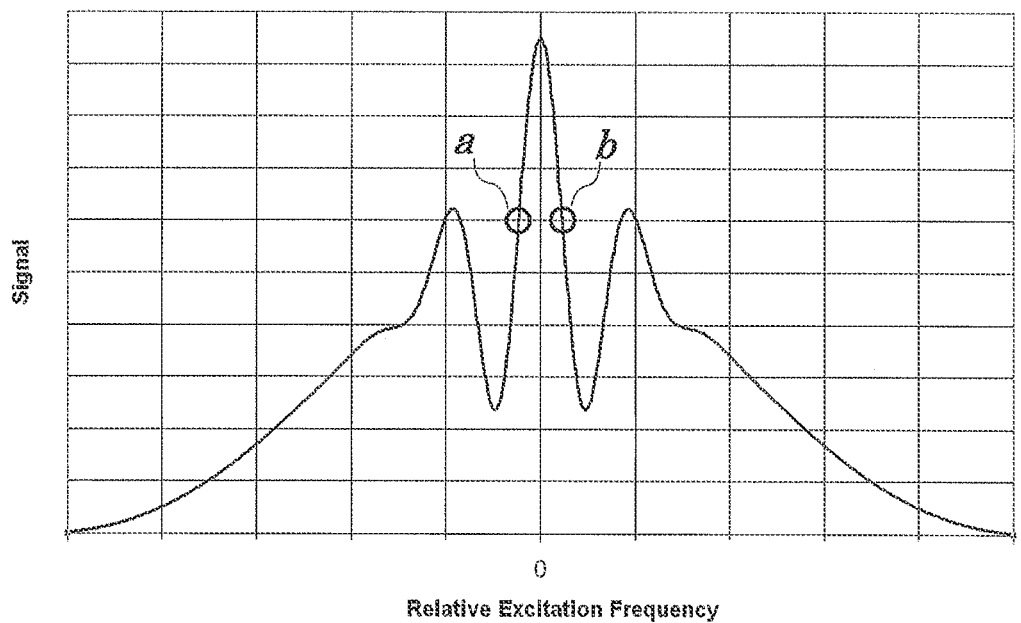
Prior Art    Fig. 2

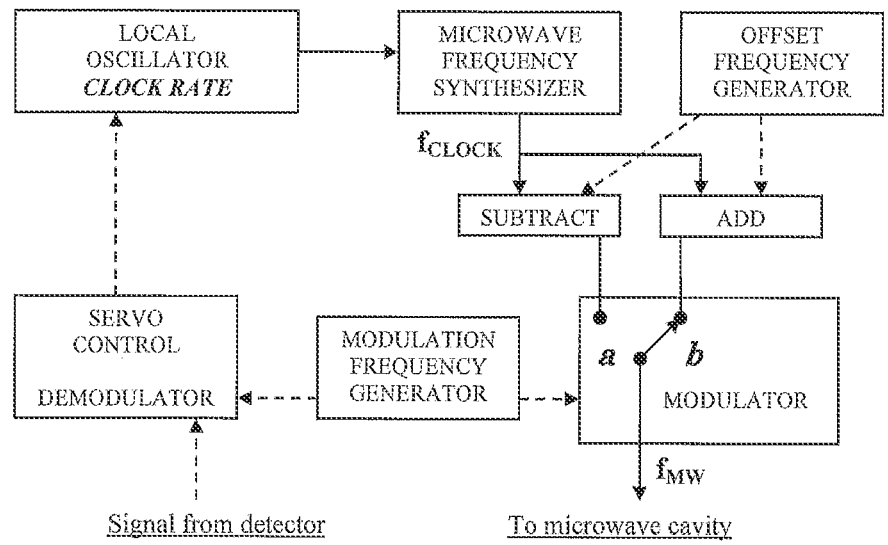
Prior Art    Fig. 3
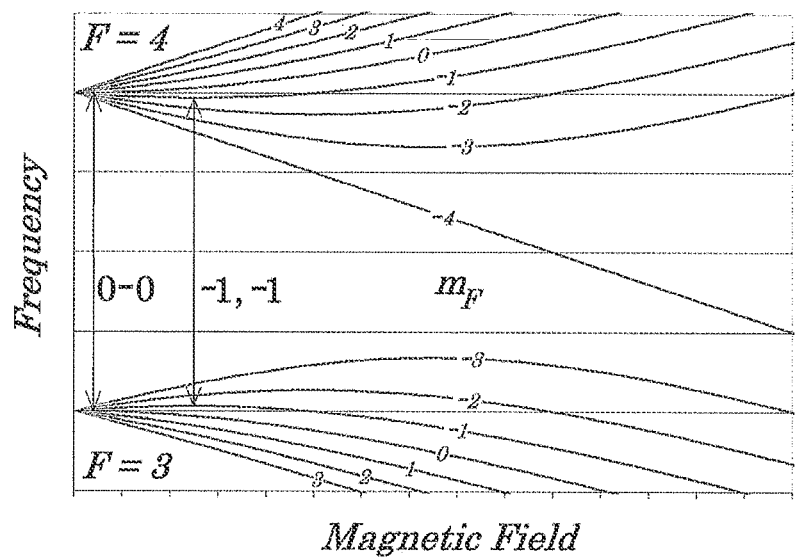
Prior Art    Fig. 4

FREQUENCY STABILIZATION OF AN ATOMIC CLOCK AGAINST VARIATIONS OF THE C-FIELD

CROSS-REFERENCE TO RELATED APPLICATIONS

This application is a national phase entry of International Patent Application PCT/CA2012/000086 filed Feb. 6, 2012 and claims the benefit of U.S. Provisional Patent Application Ser. No. USSN 61/447,850 filed Mar. 1, 2011, the entire contents of both of which are herein incorporated by reference.

FIELD OF THE INVENTION

The present invention relates to atomic clocks, in particular to atomic clocks that use the Ramsey technique of time-separated electromagnetic fields to derive their rate from an atomic transition which has no first-order dependence on the magnetic field.

BACKGROUND OF THE INVENTION

Atomic clocks maintain a stable rate by locking the frequency of their local oscillator to the frequency of a selected atomic transition. Since the frequency of an atomic transition is stable, reproducible and universal, atomic clocks are used as standards for frequency and time.

For these atomic clocks to function properly, a magnetic field (the C-field) must be applied on the atoms. A problem with presently available atomic clocks is that the C-field can change with time, causing changes in the clock rate. The C-field can change for several different reasons including aging and hysteresis of the shield material, environmental temperature fluctuations, variations of the external magnetic field, magnetization of the shields, mechanical shocks, and ageing of the electronic circuits. Furthermore, another problem arises because the C-field is not perfectly spatially uniform, causing problems in evaluating the exact rate of the clock. Spatial non-uniformities of the C-field can be caused by non-uniformities of the shield material, necessary compromises in the design such as space restrictions and access holes, and the presence of other magnetic materials.

Because the frequency inaccuracy of the atomic clock is strongly dependent on the C-field, some methods have been proposed to reduce the magnetic field sensitivity. These methods can be classified by the type of mitigation used to reduce the magnetic field sensitivity. Four of these classes are listed here.

A) Use atomic transitions with a weak frequency dependence on the C-field:

The Zeeman effect is a change of the frequency of atomic transitions as a function of the magnetic field. In most atoms, the Zeeman effect is linear for all but a few transitions, for which it is quadratic. Below a certain value of the magnetic field (atom and transition dependent), the frequency dependence of the transitions obeying the quadratic Zeeman effect is much smaller than the linear frequency dependence. Such transitions are therefore selected to operate the atomic clock. (Examples of atomic transitions obeying the quadratic Zeeman effect, the so-called 0-0 transitions, are: In cesium: the $|3, 0\rangle$–$|4, 0\rangle$ transition; this is also used in the definition of the SI second; in rubidium, the $|1, 0\rangle$–$|2, 0\rangle$ transition; in hydrogen: the $|0, 0\rangle$–$|1, 0\rangle$ transition.) The reduced sensitivity of the transition frequency on the C-field improves the stability of the clock against variations and non-uniformity of the C-field (see FIG. 4, transition labeled 0-0). However in some state-of-the-art clocks, the sensitivity is still too large. Another possibility is to use a large C-field at a value for which the frequency dependence of the transitions becomes null (De Marchi 1993). The selected transition is between the states $|3, -1\rangle$ and $|4, -1\rangle$ (shown as "–1, –1" in FIG. 4). This method suffers from the need to produce an extremely uniform C-field, which has not been done successfully yet.

B) Build very stable electronic circuits, use permanent magnets and use shielding to produce a stable C-field:

The reduction of possible changes of the C-field has also been addressed by attempting to stabilize the C-field using passive stabilization or active feedback. For a C-field generated by a current, the current can be stabilized to a constant value. Magnetic shielding is also used to mitigate magnetic field variations, and permanent magnets can be used to generate the C-field. All these methods suffer from a large sensitivity on the temperature. Temperature variations produce changes in the circuit, shields or magnets which affect the C-field.

C) Compensate using feedback from a measured value of the C-field:

Several methods have been proposed to measure the C-field and correct its value to keep it constant. One example is the "ac C-field" method (Stern 1992), which uses the average clock frequency measured with alternating polarities of the current producing the C-field. Another similar but simpler method proposes to use a dual frequency synthesizer (Rubiola 1993) to run a clock at a high C-field while simultaneously measuring the C-field.

Other methods involving some kind of adjustment to the C-field have been attempted (Lepek 1990; Rabian 1990; Stern 2003). However, it is known in the art that such C-field adjustments are not reliable (Barnes 1988), because after a C-field adjustment, the frequency often relaxes back to almost where it started. Most of such stability problems have been traced to the magnetic shields and their hysteresis effects and experts generally discourage C-field adjustments to fine tune the clock. All methods of this class suffer from these common problems: Measuring the C-field interferes with the operation of the clock and requires a complex system. If the current generating the C-field is varied, hysteresis causes linearity problems, making the active feedback system less reliable. As a result the rate of the atomic clock changes, decreasing its stability and accuracy, and thus the performance of the clock.

Yet other methods (Braun 2010) employ the idea of using a clock running on the end-transitions. Since the end-transitions are linearly dependent on local magnetic fields, an approach is taken to actively lock the local field to a predetermined value. This approach involves sensing, and with feedback electronics, maintaining the local bias field at a constant value. Therefore, these methods use a measurement of the Zeeman splitting to control the C-field with a feedback circuit where the rf magnetic field applied for the measurement is very weak for minimal disturbance of the clock. These methods also suffer from an increased complexity of the system, do not provide compensation for the non-uniformity of the C-field, and require unreliable C-field adjustments.

D) Compensate using feed-forward:

Another technique is to provide a feed-forward mechanism based on the value of the C-field. For example, U.S. Pat. No. 7,439,814 (Happer 2008) proposes the "Multi-Coherent method", which uses a combination of many microwave frequencies, radio frequencies or optical pumping to achieve multiple measurements simultaneously. However, it only reduces the dependence of the frequency on the C-field by 33% (by using an average of all $m_F$ states) and is a complex method to implement. Another description related to using feed-forward is found in the Hewlett-Packard 5062C "Cesium Beam Frequency Reference Training Manual" (November 1974). The microwave field used by the clock can be modulated with an rf signal to fine-tune its frequency. However, no indication is made on how to use this to improve the frequency stability of the clock using that system. Also, these two methods above suffer from problems associated with an increased complexity of the microwave synthesizer which affect the long-term frequency stability of the clock.

There remains a need in the art for methods of stabilizing the frequency of atomic clocks against C-field variations which does not suffers from the problems encountered in one or more of the four classes above.

SUMMARY OF THE INVENTION

In one aspect of the invention there is provided a method of stabilizing frequency of an atomic clock against variations and non-uniformity of C-field, the method comprising applying a rf magnetic field perpendicular to the C-field to cause a coherent population transfer between Zeeman states that compensates exactly for quadratic frequency shift of clock transition over a region defined by trajectory of atoms between their interaction with two rf excitations.

Thus, the present invention relates to a method in which a radio frequency (rf) magnetic field is added to the C-field to produce an asymmetry on an electromagnetic Ramsey signal, for example a microwave or optical Ramsey signal. As a result, the locking frequency of the servo control shifts in a direction opposite to the frequency shift of the clock transition. It is a feed-forward method in which 100% of the dependence of the frequency on the C-field can be compensated. The rf magnetic field is oriented perpendicular to the C-field and its frequency is tuned to a control frequency $f_C$ near the Zeeman-splitting frequency so that transitions between the $\Delta F=0$, $\Delta m_F=\pm 1$ states are possible. Two rf magnetic field pulses, timed between the electromagnetic Ramsey pulses, are applied on the atoms. The population in states |F, −1> and |F, 1> is transferred to the state |F, 0>, producing an rf Ramsey signal similar to the signal shown on FIG. 2, with the abscissa showing the difference between $f_C$ and the Zeeman-splitting frequency $f_Z$.

The frequency of the rf magnetic field is modulated at the two frequencies indicated by a and b in FIG. 2, synchronously with the modulation of the frequency of the electromagnetic field. If the Zeeman frequency $f_Z$ is equal to the control frequency $f_C$, the rf Ramsey signals are equal at points a and b and the lock point of the servo system is unaffected. However, if the value of the C-field changes, the rf Ramsey signals is unbalanced and the servo circuit locks the local oscillator to the 0-0 transition (of frequency $f_{00}$) with an offset. In a typical clock, $f_Z$ is several thousands of times more sensitive on the value of the C-field than $f_{00}$. It is thus necessary to use an rf magnetic field of small amplitude to produce an rf Ramsey signal several thousands of times smaller than the microwave signal. Also, the frequency offset of both the rf Ramsey signal and the electromagnetic Ramsey signal is positive. In order to compensate the frequency shift of the 0-0 transition, the contribution from the rf Ramsey signal is made negative by using a modulation which is out of phase with respect to the electromagnetic modulation (e.g. when the electromagnetic frequency is at point a, the rf frequency is at point b, and vice versa.) As a result, the C-field sensitivity is exactly cancelled.

Since the C-field is sampled by each atom along its individual trajectory, spatial variations of the C-field are cancelled as well as temporal variations. Thus, there is provided a method of stabilizing the frequency of an atomic clock against C-field non-uniformity and variations by applying rf magnetic oscillations. The rf magnetic oscillations produce a compensation directly at the level of the frequency servo loop. No feedback based on a measurement of the C-field has to be applied to the C-field dc current. This method improves the stability of a clock by factor determined by the amplitude stability of the rf magnetic oscillations.

Further features of the invention will be described or will become apparent in the course of the following detailed description.

BRIEF DESCRIPTION OF THE DRAWINGS

In order that the invention may be more clearly understood, embodiments thereof will now be described in detail by way of example, with reference to the accompanying drawings, in which:

FIG. 1 is a schematic diagram of a physics package of a prior art atomic clock. The frequency of its local oscillator is locked to the frequency of an atomic transition which has no first-order dependence on the magnetic field and uses the Ramsey technique of time-separated microwave fields.

FIG. 2 is an example of an ideal Ramsey signal obtained from the atomic clock of FIG. 1 as a function of the frequency of the excitation described by the function R(f).

FIG. 3 is a diagram of an electronics package used in atomic clocks.

FIG. 4 is a diagram of the hyperfine energy levels in a cesium atom. The relative frequency of each level is plotted as a function of the magnetic field.

DETAILED DESCRIPTION OF THE INVENTION

Figure 5:
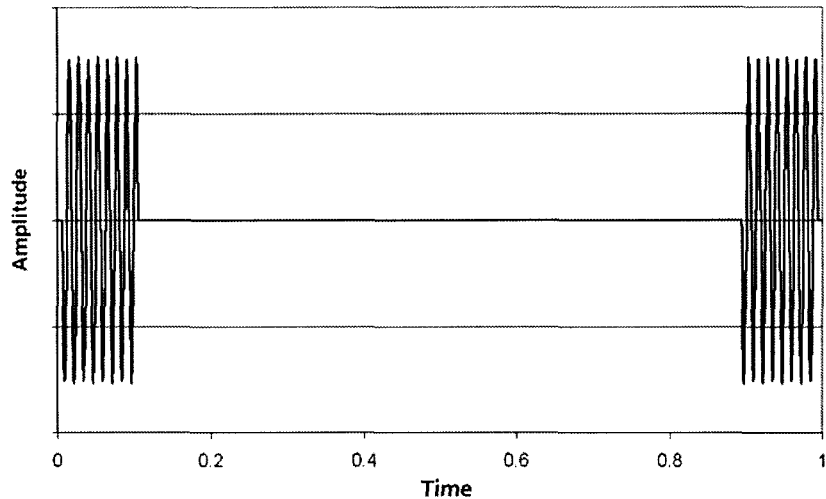
FIG. 5 is a diagram representing rf pulses applied on atoms. The time between the end of the first microwave Ramsey pulse and the beginning of the second microwave Ramsey pulse is equal to 1.

FIG. 1 is a schematic diagram of a "physics package" of a standard atomic clock. A source of cesium atoms 1 produces an atomic beam 2 directed along the longitudinal axis of the clock. The source produces atoms distributed between the possible atomic states |F, $m_F$>. A "first state selector" 3 transmits the atoms which are in any of the states $|3, m_F\rangle$ and rejects the atoms in the $|4, m_F\rangle$ states (the cesium atom is used for the discussion). Using a microwave cavity, a first microwave field 5 imposes a π/2-pulse at the hyperfine transition frequency between states $|3, 0\rangle$ and $|4, 0\rangle$ (also called the 0-0 transition or the clock transition). The result is an atomic state-superposition oscillating at the frequency of the 0-0 transition. The atoms drift in a region of constant and uniform magnetic field until they are imposed a second microwave π/2-pulse in the second microwave field 6—this is the Ramsey technique of time-separated microwave fields (Ramsey 1950). After exiting the second microwave field, the atoms will be in the $|4, 0\rangle$ state if the frequency of the microwave field is equal to the frequency of the 0-0 transition. A second state selector 4 transmits the atoms which are in any of the states $|4, m_F\rangle$ and rejects the atoms in the $|3, m_F\rangle$ states. These atoms reach the detector 7 and produce a microwave Ramsey signal. The constant and uniform magnetic field in the region between 5 and 6, called the C-field, is produced with a constant current flowing through the C-field electrodes 8 and 9. The C-field is parallel to the magnetic component of the microwave fields 5 and 6. A magnetic shield (not shown) encloses the C-field region to provide the maximum isolation from variations of external fields.

FIG. 2 shows a typical microwave Ramsey signal (called Ramsey fringes) obtained from the detector 7 in FIG. 1 as a function of the frequency $f_{MW}$ of the microwave field. The abscissa shows the difference between $f_{MW}$ and the frequency of the 0-0 transition $f_{00}$, with zero centered on the graph. When the frequency $f_{MW}$ is equal to the frequency of the 0-0 transition, the microwave Ramsey signal reaches a maximum.

FIG. 3 shows a schematic diagram of the electronics package of an atomic clock. A local oscillator determines the clock rate. Its frequency is stable but not accurate, and thus requiring an adjustment. The signal from this local oscillator is used by the microwave frequency synthesizer to generate a microwave signal at a frequency near $f_{00}$. The two frequencies of FIG. 2 a and b are generated by adding and subtracting the frequency of the signal generated by the offset frequency generator. A modulator alternately selects frequencies a and b in synchronism with the output signal from a modulation frequency generator. The output of the modulator is sent to the microwave cavity. The microwave Ramsey signal from the detector is sent to the demodulator part of a servo control. The servo control adjusts the frequency of the local oscillator to keep the microwave Ramsey signals measured at points a and b equal.

The technique keeps the frequency of the local oscillator precisely locked to the frequency of the 0-0 transition, and thus the rate of the clock remains very stable. However, the frequency of all atomic transitions is a function of the magnetic field (Zeeman effect), which implies that the clock rate is affected by the value of the C-field. FIG. 4 shows the dependence of the atomic state frequency on the magnetic field for a cesium atom. For small magnetic fields (smaller than 40 mT in cesium), all but the 0-0 transitions have a linear frequency dependence on the magnetic field (Zeeman splitting). The 0-0 transition is the transition with the smallest (but non-null) frequency sensitivity on the C-field. In order to keep the frequency of the clock as constant as possible, special care must be taken to produce a uniform C-field which will be stable over extended periods of time.

A variation of the C-field away from its nominal value $B_0$ produces a shift of the Ramsey fringe $\delta_R = C_1 \int (B^2(z) - B_0^2) dz$, where B(z) is the value of the C-field at position z integrated along the trajectory between the two microwave Ramsey excitations, and $C_1$ is a constant determined by atomic properties ($C_1$ is equal to 42.745 mHz/μT² in cesium). For small variations of the C-field away from its nominal value (B(z)−$B_0 \ll B_0$) the frequency shift of the microwave Ramsey fringe is $\delta_R = 2B_0 C_1 \int (B(z) - B_0) dz$. The frequency shift of a Zeeman transition between the $\Delta m_F = \pm 1$ states is given by $\delta_Z = C_2 \int (B(z) - B_0) dz$, where $C_2$ is a constant determined by atomic properties ($C_2$ is equal to 3.5 kHz/μT in cesium). Thus, we can express the frequency shift of the Ramsey fringe $\delta_R = 2B_0 C_1 \delta_Z / C_2 = \epsilon \delta_Z$.

Figure 6:
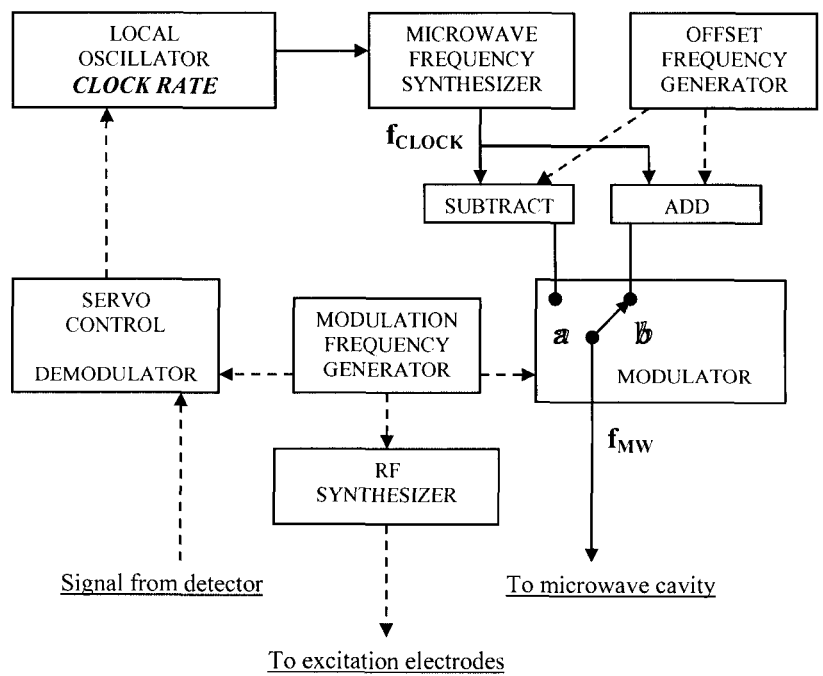
FIG. 6 is a schematic diagram of the electronics package used in an atomic clock with the additional rf synthesizer used to control the signal sent to the excitation electrodes.
Figure 10:
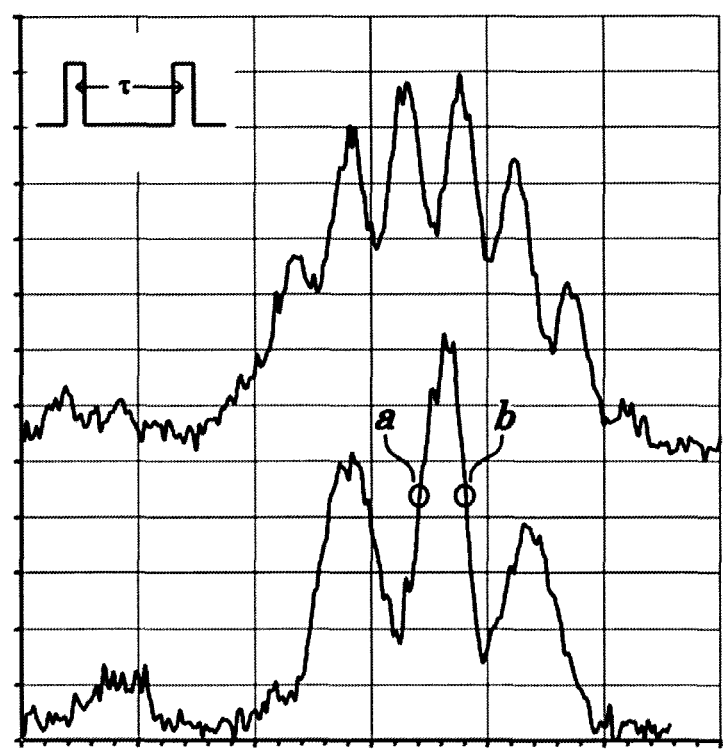
FIG. 10 is a measured rf Ramsey signal obtained from an atomic clock as a function of the frequency of the excitation described by the function R(f). The two curves are the signals obtained with different timing τ. This demonstrates how the signal can be adjusted for exact compensation.

Two rf magnetic pulses at a control frequency $f_C$ and tuned near the Zeeman frequency $f_Z = C_2 \int B(z) dz$ are added to the C-field. This is to produce a small population transfer between the $\Delta F = 0$, $\Delta m_F = \pm 1$ states. The two rf pulses are an implementation of the Ramsey technique using rf magnetic fields using the circuit shown in FIG. 6. Thus, this technique uses a rf Ramsey interrogation within a microwave Ramsey interrogation. The frequency of the rf signal is also modulated in synchronism with the microwave modulation, and so part of the signal from the detector has the dependence shown in FIG. 2, with the abscissa showing $f_C - f_Z = f_C - C_2 \int B(z) dz$. Since the Zeeman frequency shift is much larger than the Ramsey shift ($\delta_Z / \delta_R$ is equal to $1/\epsilon = 6820$ for a typical field of 6 μT in a commercial cesium beam clock), the rf pulses need only to have a small amplitude such that only a small fraction of the population is transferred. Such an rf Ramsey signal is confirmed experimentally (Marmet 2011) and is shown in FIG. 10.

Figure 9:
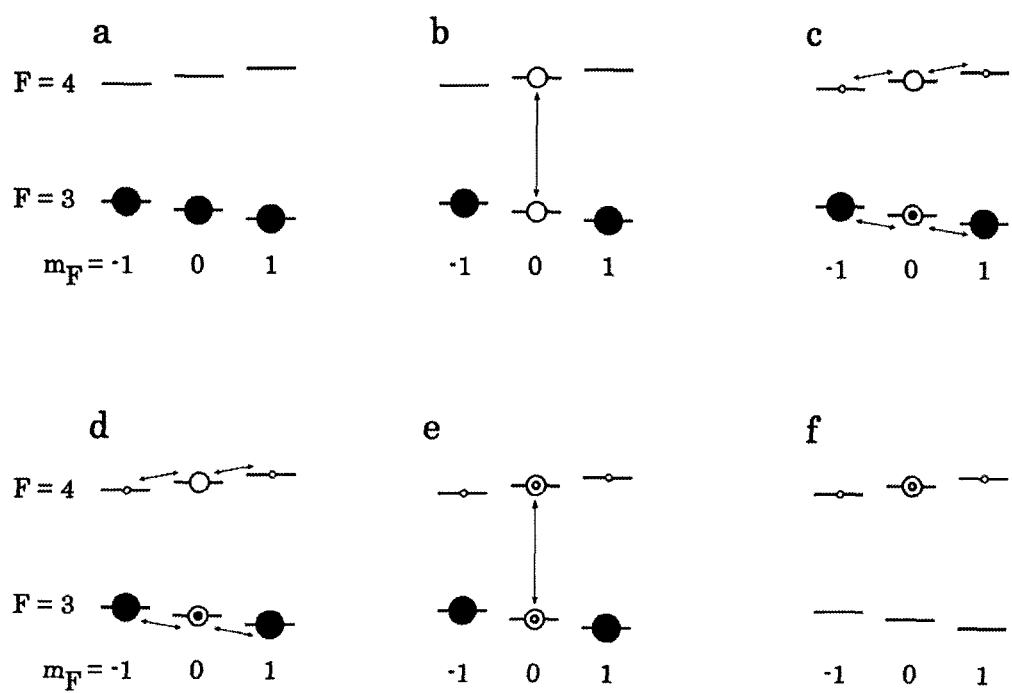
FIG. 9 is a diagram of an embodiment of a method of the present invention. The populations in the relevant states are shown by the circles: a) after the first state selector, b) after the first microwave Ramsey pulse, c) after the first rf Ramsey pulse, d) after the second rf Ramsey pulse, e) after the second microwave Ramsey pulse, f) after the second state selector.

The states of interest for the microwave Ramsey interrogation are the states $|3, 0\rangle$ and $|4, 0\rangle$ (the notation $|F, m_F\rangle$ is used). Since the rf magnetic pulses have a small amplitude, these two states connect to the states $|3, -1\rangle$, $|3, 1\rangle$, $|4, -1\rangle$ and $|4, 1\rangle$. The contribution from the other states is negligible and not considered in this discussion. Here, we use non-normalized populations to describe the populations in each state $a_{3-1}|3, -1\rangle$, $a_{30}|3, 0\rangle$, $a_{31}|3, 1\rangle$, $a_{4-1}|4, -1\rangle$, $a_{40}|4, 0\rangle$ and $a_{41}|4, 1\rangle$, and $\rho_{3-1}=|a_{3-1}|^2$, $\rho_{30}=|a_{30}|^2$, $\rho_{31}=|a_{31}|^2$, $\rho_{4-1}=|a_{4-1}|^2$, $\rho_{40}=|a_{40}|^2$, and $\rho_{41}=|a_{41}|^2$. FIG. 9 shows a diagram of the atomic populations, with cesium being used as an example. FIG. 9a: After the first state selector, only the atoms with populated $|3, m_F\rangle$ states are transmitted. The populations are and $\rho_{3-1}=\rho_{30}=\rho_{31}=1$ and $\rho_{4-1}=\rho_{40}=\rho_{41}=0$. FIG. 9b: The first microwave Ramsey pulse produces a coherent state-superposition between the states $|3, 0\rangle$ and $|4, 0\rangle$, with $\rho_{3-1}=\rho_{31}=1$, $\rho_{4-1}=\rho_{41}=0$, and $\rho_{30}=\rho_{40}=0.5$. FIG. 9c: The first rf Ramsey pulse produces several coherent state-superposition between the following states: $|3, -1\rangle$ and $|3, 0\rangle$, $|3, 1\rangle$ and $|3, 0\rangle$, $|4, -1\rangle$ and $|4, 0\rangle$, and $|4, 1\rangle$ and $|4, 0\rangle$. The resulting populations are $\rho_{3-1}=\rho_{31}=1-3\epsilon/8$, $\rho_{30}=0.5+\epsilon/4$, $\rho_{4-1}=\rho_{41}=\epsilon/8$ and $\rho_{40}=0.5-\epsilon/4$. The value of ε is related to the amplitude of the rf magnetic field and is kept small (of the order of $\delta_R/\delta_Z$). FIG. 9d: The second rf Ramsey pulse, is phase shifted by δ/2 (that is, the rf frequency tuned to points a or b on FIG. 2) and produces more population transfers between the states: $|3, -1\rangle$ and $|3, 0\rangle$, $|3, 1\rangle$ and $|3, 0\rangle$, $|4, -1\rangle$ and $|4, 0\rangle$, and $|4, 1\rangle$ and $|4, 0\rangle$. The resulting populations are $\rho_{30}=0.5+\epsilon R(f_C-f_Z)$, $\rho_{4-1}=\rho_{41}=\epsilon R(f_C-f_Z)/2$ and $\rho_{40}=0.5-\epsilon R(f_C-f_Z)$, where $R(f_C-f_Z)$ is the Ramsey function plotted in FIG. 2. FIG. 9e: The second microwave Ramsey pulse produces more population transfer between the states $|3, 0\rangle$ and $|4, 0\rangle$, resulting in the populations $\rho_{4-1}=\rho_{41}=\epsilon R(f_C-f_Z)/2$ and $\rho_{40}=R(f_{MW}-f_{00})$. FIG. 9f: After the second state selector, only the atoms with populated $|4, m_F\rangle$ states are transmitted, resulting in the populations $\rho_{3-1}=\rho_{30}=\rho_{31}=0$, $\rho_{4-1}=\rho_{41}=$ $\epsilon R(f_C-f_Z)/2$, and $\rho_{40}=R(f_{MW}-f_{00})$. Finally, the detector measures the total population resulting in a signal $$S=\rho_{3-1}+\rho_{30}+\rho_{31}+\rho_{4-1}+\rho_{40}+\rho_{41}=R(f_{MW}-f_{00})+\epsilon R(f_C-f_Z).$$ Eq. (1)

(Without rf pulses (e.g. $\epsilon=0$, prior art), the detected signal would be $S_0=R(f_{MW}-f_{00})$.)

The feedback signal S is calculated by using the function R(f) at the two operating points FIG. 2 a and b. Near these points, the function can be simplified to the linear relation (first order Taylor expansion) $R(f)=½+\beta(\Delta f\pm f)$, where $\Delta f$ is the offset frequency, the "−" is for point a on FIG. 2, and "+" is for point b on FIG. 2. In order to compensate the frequency shift of the 0-0 transition, the contribution from the rf Ramsey signal is made negative by using a modulation which is out of phase with respect to the microwave modulation (e.g. when the microwave frequency is at point a, the rf frequency is at point b, and vice versa.) The signal is then $$S=\pm\beta[(f_{CLOCK}-f_{00})-\epsilon(f_C-f_Z)]+(1+\epsilon)(½+\beta\Delta f).$$

Using $$f_{00}=C_1\int B_0^2 dz+\delta_R$$

and $$f_Z-f_C=C_2\int B(z)dz-C_2\int B_0 dz=\delta_Z=\delta_R C_2/(2B_0 C_1),$$

the signal is $$S=\pm\beta[f_{CLOCK}-\delta_R(1-\epsilon C_2/(2B_0 C_1))]+K,$$

where K is a constant. The servo control modifies $f_{CLOCK}$ in order to keep the signal S constant. The value of $\delta_R$ depends on the C-field, but with the choice $\epsilon=2B_0 C_1/C_2$ it is multiplied by zero, therefore removing the dependence of the signal S on the value of the C-field.

Thus, by selecting the amplitude of the rf pulses so that $\epsilon=2B_0 C_1/C_2$, the frequency shift of the rf Ramsey signal will cancel the frequency shift of the microwave Ramsey signal. The small value of $\epsilon<0.0002$ needed for this method is to be contrasted to the large population transfer (effectively 100% or $\epsilon=1$) used in the "Multi-Coherent method" (Happer 2008) where the $m_F=0, \pm1, \pm2$, etc. states are completely mixed by large rf signals.

With the appropriate selection of the rf pulses amplitude, the rf Ramsey signal added to the microwave Ramsey fringes (the error signal steering the frequency of the clock) cancels and C-field deviation away from the nominal value determined by the frequency of the rf oscillations $f_C$. Since the C-field is sampled by each atom along its individual trajectory (as represented by the integral $\int B(z)\,dz$), spatial variations of the C-field are cancelled as well as temporal variations. Thus, there is provided a method of stabilizing the frequency of an atomic clock against C-field non-uniformity and temporal variations by applying rf magnetic pulses perpendicular to the C-field to cause a coherent population transfer between Zeeman states that compensates for the quadratic frequency shift of transitions of the clock. Thus, the rf magnetic pulses produce a compensation directly at the level of the frequency servo loop. No feedback based on a measurement of the C-field has to be applied to the C-field dc current.

The dc current producing the C-field does not need to be actively modified, the microwave synthesizer circuit need not be modified from prior art and no additional measurement cycle is necessary. This can improve the stability of a clock by a large factor (e.g. by a factor of five or more) against changes of the C-field without changing other aspects of the clock. Leaving other aspects of the clock alone is a desirable practice when working with standards, especially when long term stability is important.

The present invention may be implemented in any atomic clock, for example a fountain clock or a beam clock. The atomic species used for the frequency reference must have the proper spectroscopic structure, such an alkali metal standard (e.g. a cesium standard or a rubidium standard). It is an advantage of the present invention that its implementation in an atomic clock is relatively straightforward and inexpensive. Implementation requires only a few excitation electrodes to be added to the central part of an existing clock design, preferably inside all metal layers since the rf magnetic field is cancelled by conductors.

EXAMPLES

Figure 7:
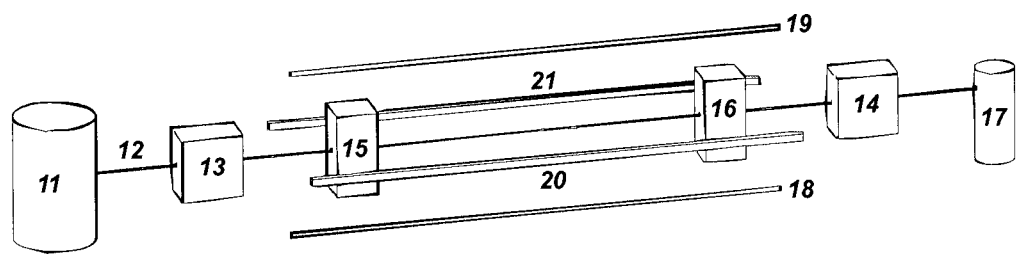
FIG. 7 is a schematic diagram of a physics package of an atomic clock in a first embodiment of the present invention. This is FIG. 1 with additional electrodes that produce a magnetic field perpendicular to the C-field over the entire length of the interrogation region.

Embodiment #1: Excitation Electrodes Producing a Transversal Field Over the Entire Region of the C-Field Referring to FIG. 7, a first embodiment of an atomic clock in accordance with the present invention has many of the same features as a standard atomic clock including source of cesium atoms 11, atomic beam 12, $1^{st}$ state selector 13, $1^{st}$ microwave field 15, $2^{nd}$ microwave field 16, $2^{nd}$ state selector 14, detector 17 and C-field electrodes 18 and 19. In this embodiment, a series of pulses are generated regularly, spaced in time so that a pair of pulses fits within the time between the two microwave Ramsey excitations. Two additional "excitation electrodes" 20 and 21 produce a magnetic field which is transversal (in relation to the axis of atomic beam 12) and perpendicular to the C-field, over the entire length between microwave pulses 15 and 16. The signal sent to the excitation electrodes is generated with the circuit depicted in FIG. 6. The pulses are shown in FIG. 5, where the time between two microwave Ramsey excitations is equal to 1 on the abscissa. Depending on their position, the atoms are subjected to one or two rf magnetic pulses. Most atoms are subjected to only one rf pulse during the time between the microwave Ramsey pulses. However, the atoms receiving the first rf magnetic pulse just after the first Ramsey pulse will be subjected to two rf pulses. For those atoms, the method is applicable. With rf pulses as shown in FIG. 5, about 10% of the atoms participate to the rf Ramsey signal. The smaller signal can be compensated by using a value for $\epsilon$ ten times larger.

Figure 8:
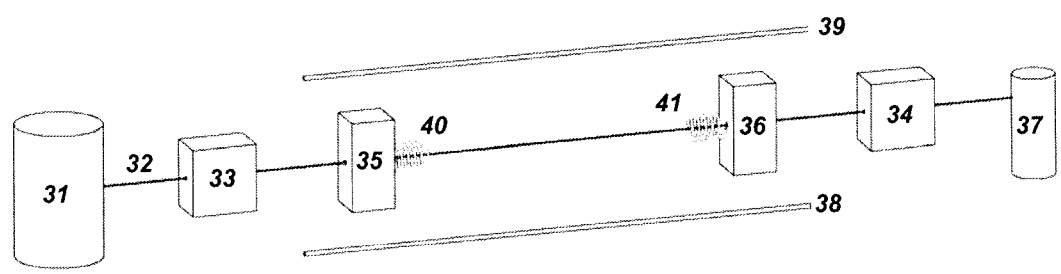
FIG. 8 is a schematic diagram of a physics package of an atomic clock in a second embodiment of the present invention. This is FIG. 1 with additional electrodes that produce a magnetic field perpendicular to the C-field over a part of the interrogation region.

Embodiment #2: Excitation Electrodes Producing a Longitudinal Field over Two Short Sections Near the Microwave Excitation Regions Referring to FIG. 8, a second embodiment of an atomic clock in accordance with the present invention has many of the same features as a standard atomic clock including source of cesium atoms 31, atomic beam 32, $1^{st}$ state selector 33, $1^{st}$ microwave field 35, $2^{nd}$ microwave field 36, $2^{nd}$ state selector 34, detector 37 and C-field electrodes 38 and 39. In this embodiment, a constant rf magnetic field is produced but since the rf fields are localized, the atoms experience two pulses between the two microwave Ramsey excitations. Two additional "excitation electrodes" 40 and 41 produce a magnetic field which is longitudinal (parallel to the atomic beam) and perpendicular to the C-field, over short lengths near the microwave excitation fields 35 and 36. The signal sent to the excitation electrodes is generated with the circuit depicted in FIG. 6. The temporal pulses experienced by the atoms are shown in FIG. 5, where the time between two microwave Ramsey excitations is equal to 1 on the abscissa. All atoms are subjected to two rf magnetic pulses and the method is applicable as described above with a small value of $\epsilon$.

Embodiment #3: A Clock with an Atomic Source Producing Atoms Only in the State $|3, 0\rangle$, e.g. Some Fountain Clocks In this embodiment, the electrode set-ups of embodiment #1 or #2 can be used. In this case, the method uses the small difference between the Zeeman frequency splitting between the $|3, m_F\rangle$ states and the splitting between the $|4, m_F\rangle$ states. The constant $C_2$ used above is specific to the value of F, e.g. $C_2(F=3)=3509.8$ Hz/µT and $C_2(F=4)=3498.6$ Hz/µT in cesium. After the first state selector, the populations are $\rho_{30}=1$, and $\rho_{3-1}=\rho_{31}=\rho_{4-1}=\rho_{40}=\rho_{41}=0$. The first microwave Ramsey pulse produces a coherent state-superposition between the states $|3, 0\rangle$ and $|4, 0\rangle$, giving $\rho_{3-1}=\rho_{31}=\rho_{4-1}=\rho_{41}=0$ and $\rho_{30}=\rho_{40}=0.5$. The first rf Ramsey pulse produces the populations $\rho_{3-1}=\rho_{31}=\rho_{4-1}=\rho_{41}=\epsilon/8$ and $\rho_{30}=\rho_{40}=0.5-\epsilon/4$. The value of $\epsilon$ is related to the amplitude of the rf magnetic field and is kept small (of the order of $\delta_R/\delta_Z$). The second rf Ramsey pulse, is phase shifted by $\pi/2$ (that is, the rf frequency tuned to points a or b on FIG. 2). The resulting populations are $\rho_{30}=0.5+\epsilon R(f_C-f_{Z3})$, $\rho_{4-1}=\rho_{41}=\epsilon R(f_C-f_{Z4})/2$ and $\rho_{40}=0.5-\epsilon R(f_C-f_{Z4})$, where $R(f_C-f_{ZF})$ is the Ramsey function plotted in FIG. 2 and $f_{ZF}$ is $f_Z$ calculated with the constants $C_2(F)$. The second microwave Ramsey pulse produces the populations $\rho_{4-1}=\rho_{41}=\epsilon R(f_C-f_{Z4})/2$ and $\rho_{40}=R(f_{MW}-f_{00})-\epsilon[R(f_C-f_{Z3})+R(f_C-f_{Z4})]/2$. After the second state selector, only the atoms with populated $|4, m_F\rangle$ states are transmitted, resulting in $\rho_{3-1}=\rho_{30}=\rho_{31}=0$. Finally, the detector measures the total population resulting in a signal $S=\rho_{3-1}+\rho_{30}+\rho_{31}+\rho_{4-1}+\rho_{40}+\rho_{41}=R(f_{MW}-f_{00})+\epsilon[R(f_C-f_{Z4})-R(f_C-f_{Z3})]/2$.

The feedback signal S is used in the same way as the signal of Eq. (1), except that here the correction term $R(f_C-f_{Z4})-R(f_C-f_{Z3})$ provides the sensitivity on the C-field to be used as a first-order correction to the second-order Zeeman shift.

References: The contents of the entirety of each of which are incorporated by these references.

Barnes J A, Rodrigo E A. (1988) "Fine Tuning of Atomic Frequency Standards," U.S. Pat. No. 4,740,761 issued Apr. 26, 1988.

Braun A M, Abeles J H, Kwakernaak M, Davis T J. (2010) "Batch-Fabricated, Rf-Interrogated, End Transition, Chip-Scale Atomic Clock". U.S. Pat. No. 7,852,163 issued Dec. 14, 2010.

De Marchi A., "The high C-field concept for an accurate cesium beam resonator," *Proc. 7th European Frequency and Time Forum*, Neuchâtel, Switzerland, March 1993.

Happer W, Jau Y Y, Gong F. (2008) "Method and system for operating an atomic clock with simultaneous control of frequency and magnetic field." U.S. Pat. No. 7,439,814 issued Oct. 21, 2008.

Hewlett-Packard 5062C (1974) "Cesium Beam Frequency Reference Training Manual." http://www.leapsecond.com/museum/hp5062c/theory.htm, November 1974.

Lepek A, Stern A. (1990) "Elimination of Magnetic Influence on Atomic Clocks," U.S. Pat. No. 4,953,148 issued Aug. 28, 1990.

Marmet L, Gertsvolf M. (2010) "Evaluation of NRC-FCs1: Mapping the C-field using the Larmor Frequency." *IEEE International Frequency Control Symposium*. 312-317, 2010.

Marmet L. (2011) "Reduction of the Magnetic Sensitivity of an Atomic Clock Against the non-Uniformity and Variations of the C-field", *IEEE International Frequency Control Symposium*, 1-5.

Rabian J, Potet J-C, Buchon M. (1990) "Atomic Clock," U.S. Pat. No. 4,943,955 issue Jul. 24, 1990.

Ramsey N. F. (1950) "A Molecular Beam Resonance Method with Separated Oscillating Fields," Physical Review, Vol. 78, Issue 6: 695-699; Jun. 15, 1950.

Rubiola E, Del Casale A, De Marchi A. (1993) "A Dual Frequency Synthesis Scheme for a High C Field Cesium Resonator." *Proceedings of the 47th IEEE International Frequency Control Symposium*. 105, 1993.

Stern A, Levy B, Bootnik M, Detoma E, Pedrotto G. (1992) "Rubidium Frequency Standard with a high Resolution Digital Synthesizer." *Proceedings of the 46th IEEE International Frequency Control Symposium*. 108, 1992.

Stern A, Levy B. (2003) "Atomic Frequency Standard and System Having Improved Long Term Aging." U.S. Pat. No. 6,614,321 issued Sep. 2, 2003.

Other advantages that are inherent to the structure are obvious to one skilled in the art. The embodiments are described herein illustratively and are not meant to limit the scope of the invention as claimed. Variations of the foregoing embodiments will be evident to a person of ordinary skill and are intended by the inventor to be encompassed by the following claims.

The invention claimed is:

1. A method of stabilizing frequency of an atomic clock against variations and non-uniformity of C-field, the method comprising applying microwave Ramsey pulses to a source of atoms before and after the atoms drift in the C-field along a trajectory to produce a microwave Ramsey signal, and applying a radiofrequency (rf) magnetic field perpendicular to the C-field to cause a coherent population transfer between Zeeman states that compensates for quadratic frequency shift of clock transition over a region defined by the trajectory between their interaction with two rf excitations of the rf magnetic field.

2. The method according to claim 1, wherein the atomic clock has an atomic source that produces a continuous beam of atoms distributed over more than one magnetic state, and wherein population in adjacent states $m_F=-1$ and $m_F=1$ are used to produce the compensation for the quadratic frequency shift.

3. The method according to claim 2, wherein electrodes generate the rf magnetic field over an entire Ramsey interrogation region over which the microwave Ramsey pulses are applied to the atoms, and the electrodes are powered by periodic rf current-pulses having a period with pulse-pairs timed to fit between the microwave Ramsey pulses.

4. The method according to claim 2, wherein spatially separate electrodes continuously generate two rf magnetic field regions over which the atoms interact with the two rf excitations, the rf magnetic field regions separated by enough distance to fit between the microwave Ramsey pulses of a Ramsey interrogation region over which the microwave Ramsey pulses are applied to the atoms.

5. The method according to claim 1, wherein the atomic source is pulsed and produces atoms in a single hyperfine state $m_F=0$, and different Zeeman-splittings of lower and upper levels are used to produce the compensation for the quadratic frequency shift.

6. The method according to claim 5, wherein electrodes generate the rf magnetic field over an entire Ramsey interrogation region over which the microwave Ramsey pulses are applied to the atoms, and the electrodes are powered by periodic rf current-pulses having a period with pulse-pairs timed to fit between the microwave Ramsey pulses.

7. The method according to claim 5, wherein one electrode continuously generates one rf magnetic field region for generating at least one of the two rf excitations, located just above an a microwave Ramsey pulse.

8. The method according to claim 1, wherein the atomic source produces a continuous beam of atoms in a single hyperfine state $m_F=0$, and different Zeeman-splittings of lower and upper levels are used to produce the compensation for the quadratic frequency shift.

9. The method according to claim 8, wherein electrodes generate the rf magnetic field over an entire Ramsey interrogation region over which the microwave Ramsey pulses are applied to the atoms, and the electrodes are powered by periodic rf current-pulses having a period with pulse-pairs timed to fit between the microwave Ramsey pulses.

10. The method according to claim 8, wherein one electrode continuously generates one rf magnetic field region for generating at least one of two rf excitations, located just above a microwave Ramsey pulse.

* * * * *